United States Patent
Furuie et al.

(10) Patent No.: US 7,336,036 B2
(45) Date of Patent: Feb. 26, 2008

(54) ORGANIC ELECTROLUMINESCENT DISPLAY DEVICE

(75) Inventors: Masamitsu Furuie, Mobara (JP); Naoki Tokuda, Mobara (JP)

(73) Assignee: Hitachi Displays, Ltd., Chiba-ken (JP)

( * ) Notice: Subject to any disclaimer, the term of this patent is extended or adjusted under 35 U.S.C. 154(b) by 0 days.

(21) Appl. No.: 11/704,933

(22) Filed: Feb. 12, 2007

(65) Prior Publication Data

US 2007/0195043 A1    Aug. 23, 2007

(30) Foreign Application Priority Data

Feb. 20, 2006    (JP) ............................. 2006-042310

(51) Int. Cl.
*G09G 3/10* (2006.01)
(52) U.S. Cl. .............................. 315/169.3; 315/169.1; 345/36; 345/90; 345/63
(58) Field of Classification Search .. 315/169.1–169.3; 345/36, 44–46, 22, 52, 55, 90; 349/48, 144; 257/E27.111, 72; 438/149
See application file for complete search history.

(56) References Cited

U.S. PATENT DOCUMENTS

| | | | | |
|---|---|---|---|---|
| 6,939,750 | B2 * | 9/2005 | Hotta et al. | 438/149 |
| 7,145,623 | B2 * | 12/2006 | Sasaki | 349/144 |
| 2005/0134534 | A1 * | 6/2005 | Yamada et al. | 345/63 |
| 2006/0158095 | A1 * | 7/2006 | Imamura | 313/500 |
| 2007/0096135 | A1 * | 5/2007 | Matsumoto | 257/99 |

* cited by examiner

*Primary Examiner*—Haissa Philogene
(74) *Attorney, Agent, or Firm*—Reed Smith LLP; Stanley P. Fisher, Esq.; Juan Carlos A. Marquez, Esq.

(57) ABSTRACT

The present invention narrows a picture frame size by deciding line widths of respective power source bus lines which supply electricity to organic EL elements of respective colors corresponding to current quantities of the respective power source bus lines. Red pixels, green pixels and blue pixels which are arranged in a matrix array and, and power source lines which are connected to the respective pixels are formed in a display region, and power source bus lines which supply electricity to these power source lines are formed in a picture frame region. The power source bus line for red of a large current quantity is arranged on a side close to the display region and the power source bus line for green of a small current quantity is arranged on an outer side.

6 Claims, 5 Drawing Sheets

ORGANIC ELECTROLUMINESCENT DISPLAY DEVICE

CROSS-REFERENCE TO RELATED APPLICATIONS

The disclosure of Japanese Patent Application No. 2006-042310 filed on 2006/02/20 (yyyy/mm/dd) including the claims, the specification, the drawings and the abstract is incorporated herein by reference in its entirety.

BACKGROUND

1. Field of the Invention

The present invention relates to an organic EL display device which uses organic EL elements as pixels, and more particularly to an improved power source wiring which supplies electricity allowing the organic EL elements to emit light.

2. Description of the Related Art

An organic EL element is driven by an electric current and hence, it is necessary to eliminate the non-uniformity of the distribution of brightness in a display screen within a panel display region by arranging a bold power source line outside a panel display region thus suppressing a voltage drop of a power source. Accordingly, a size of a so-called picture frame is increased thus interrupting the miniaturization of a profile of a panel.

To achieve the miniaturization of the picture frame, in the above-mentioned patent document 1, there is described an organic EL display device which decreases a line width of the power source line by constituting a power source line which supplies electricity to respective organic EL elements of respective colors (R, G, B), for example, a power source line for the organic EL element B positioned on an outermost side using a first-layer conductive film and a second-layer conductive film.

[Patent document 1] JP-A-2004-62160

SUMMARY

In the above-mentioned patent document 1, although the voltage drop is suppressed by stacking two conductive films having small line widths for decreasing the picture frame size, no consideration is taken with respect to the line width of the power source lines for respective colors corresponding to the light emitting efficiencies of the organic EL elements for respective colors.

Accordingly, it is an object of the present invention to provide an organic EL display device which can decide respective line widths of power source lines which supply electricity to organic EL elements of respective colors corresponding to current quantities of the respective power source lines and can decrease a picture frame size thereof.

The present invention is directed to an organic EL display device which includes power source lines which are connected to a plurality of organic EL elements for respective colors and power source lines to which the power source lines are connected (hereinafter referred to as "power source bus lines"), and the power source bus line having a large current quantity is arranged on a side close to a display region for reducing the influence of a voltage drop attributed to the power source line.

Further, the present invention is characterized by increasing a width of the power source bus line with a large current quantity. Further, the power source bus line with a small current quantity is arranged outside the power source bus line with the large current quantity, and the power source line and the contact hole are connected with each other via a connection line made of a high-resistant material which is formed on a lower layer of the power source bus line.

As described above, according to the present invention, the widths of the power source bus lines for respective colors can be optimized within a range that the non-uniformity of the brightness in-plane distribution attributed to a voltage drop does not occur thus realizing the acquisition of an organic EL display device which can reduce a picture frame size while maintaining the display quality.

DETAILED DESCRIPTION OF THE INVENTION

Hereinafter, the present invention is explained in conjunction with embodiments by reference to drawings.

EMBODIMENT 1

Figure 1A:
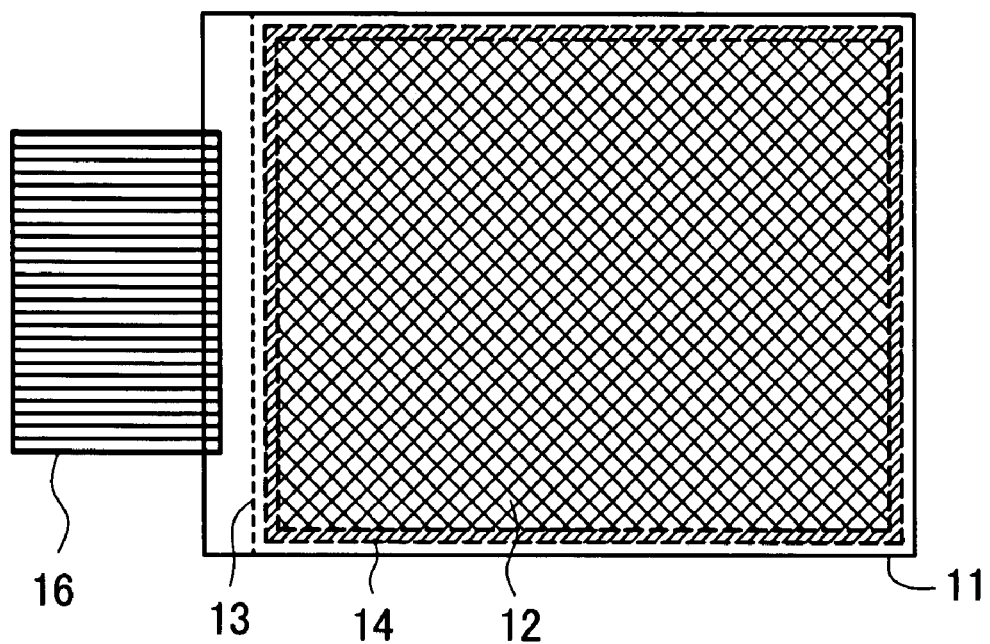
FIG. 1 is a general appearance view of an organic EL display device according to the present invention.
Figure 1B:
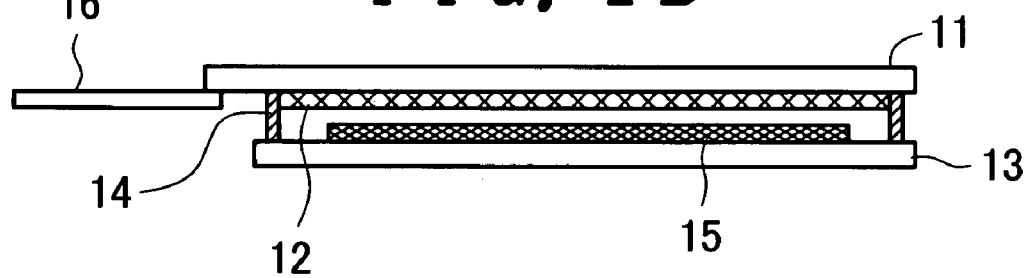

FIG. 1A and FIG. 1B are general appearance views of an organic EL display device according to the present invention, wherein FIG. 1A is a front view and FIG. 1B is a cross-sectional view. In FIG. 1A and FIG. 1B, a pixel part 12 is formed on a display substrate (display panel) 11, and the pixel part 12 is sealed by the display substrate 11, a sealing substrate 13 which faces the display substrate 11, and a sealing material 14. In a sealed space, for preventing the degradation of organic EL elements in the pixel part 12 due to moisture, a desiccant material 15 is sealed. Further, on the display substrate 11, an FPC (Flexible Printed Circuit) 16 for supplying signal for driving the organic EL elements and for supplying electricity from a power source part is mounted.

Figure 2:
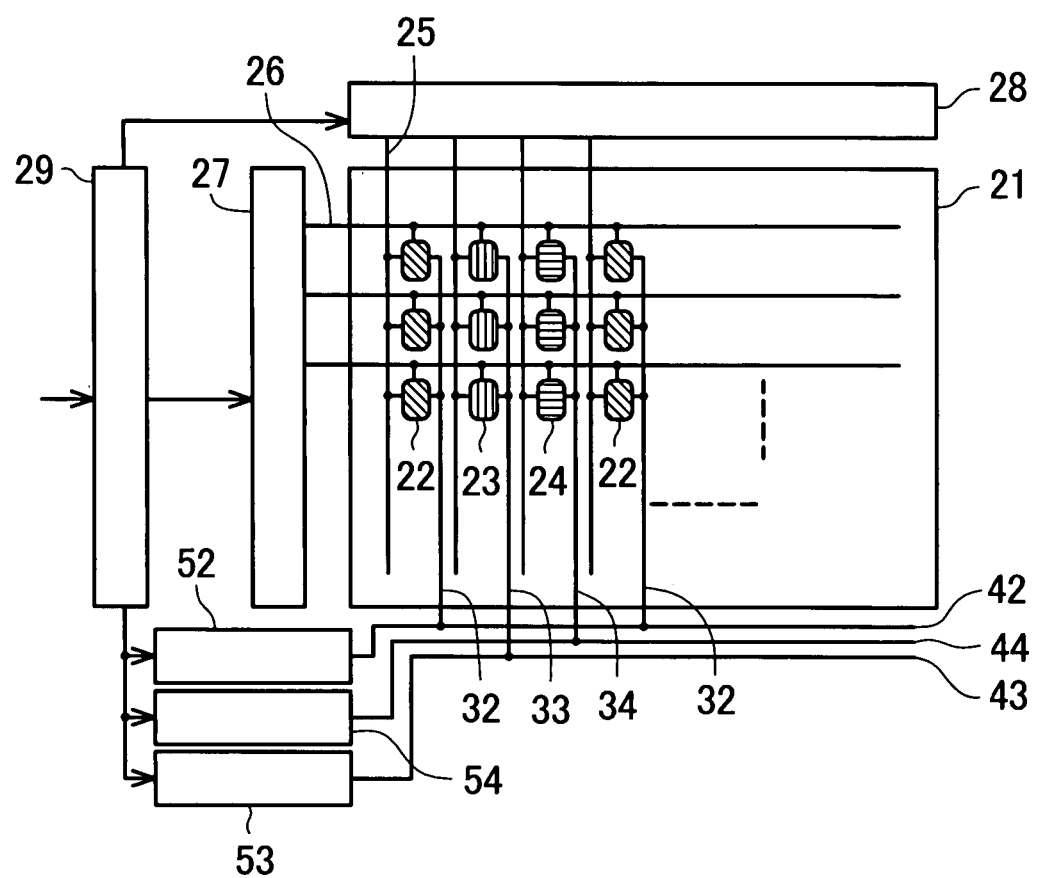
FIG. 2 is a drive circuit diagram of the organic EL display device shown in FIG. 1.

FIG. 2 is a drive circuit diagram of the organic EL display device shown in FIG. 1. In FIG. 1, for performing a full color display, within a display region 21, red pixels 22 which are constituted of an organic EL element emitting in red, green pixels 23 which are constituted of an organic EL element emitting in green, and blue pixels 24 which are constituted of an organic EL element emitting in blue are arranged in a matrix array.

Here, in this embodiment, although three colors of red, green and blue are explained as color pixels, besides these colors, two colors consisting of water color and orange color or four colors of red, green, blue and white may be used, and the number of colors of color pixels may not be limited.

The plurality of red pixels 22 are connected to power source lines 32, the power source lines 32 are connected to a power source bus line 42, and the power source bus line 42 is connected to a red-light-emitting power source part 52. In this manner, the red pixels 22 emit light due to electricity supplied from the red-light-emitting power source part 52.

In the same manner, the plurality of green pixels 23 are connected to power source lines 33, the power source lines 33 are connected to a power source bus line 43, and the power source bus line 43 is connected to a green-light-emitting power source part 53. In this manner, the green pixels 23 emit light due to electricity supplied from the green-light-emitting power source part 53.

In the same manner, the plurality of blue pixels 24 are connected to power source lines 34, the power source lines 34 are connected to a power source bus line 44, and the power source bus line 44 is connected to a blue-light-emitting power source part 54. In this manner, the blue pixels 24 emit light due to electricity supplied from the blue-light-emitting power source part 54.

The plurality of color pixels 22, 23, 24 which are arranged in a matrix array are connected to data lines 25 and scanning lines 26, and are driven in response to scanning signals of scanning lines 26 which are selected by a scanning signal drive circuit 27 and data signals from data lines 25 which are connected to a data signal drive circuit 28.

A display control part 29 receives a signal from the outside and supplies the scanning signals and the data signals to the scanning signal drive circuit 27 and the data signal drive circuit 28. Further, the display control part 29 controls color-light-emitting power source parts 52, 53, 54 which are independent from each other.

Figure 3:
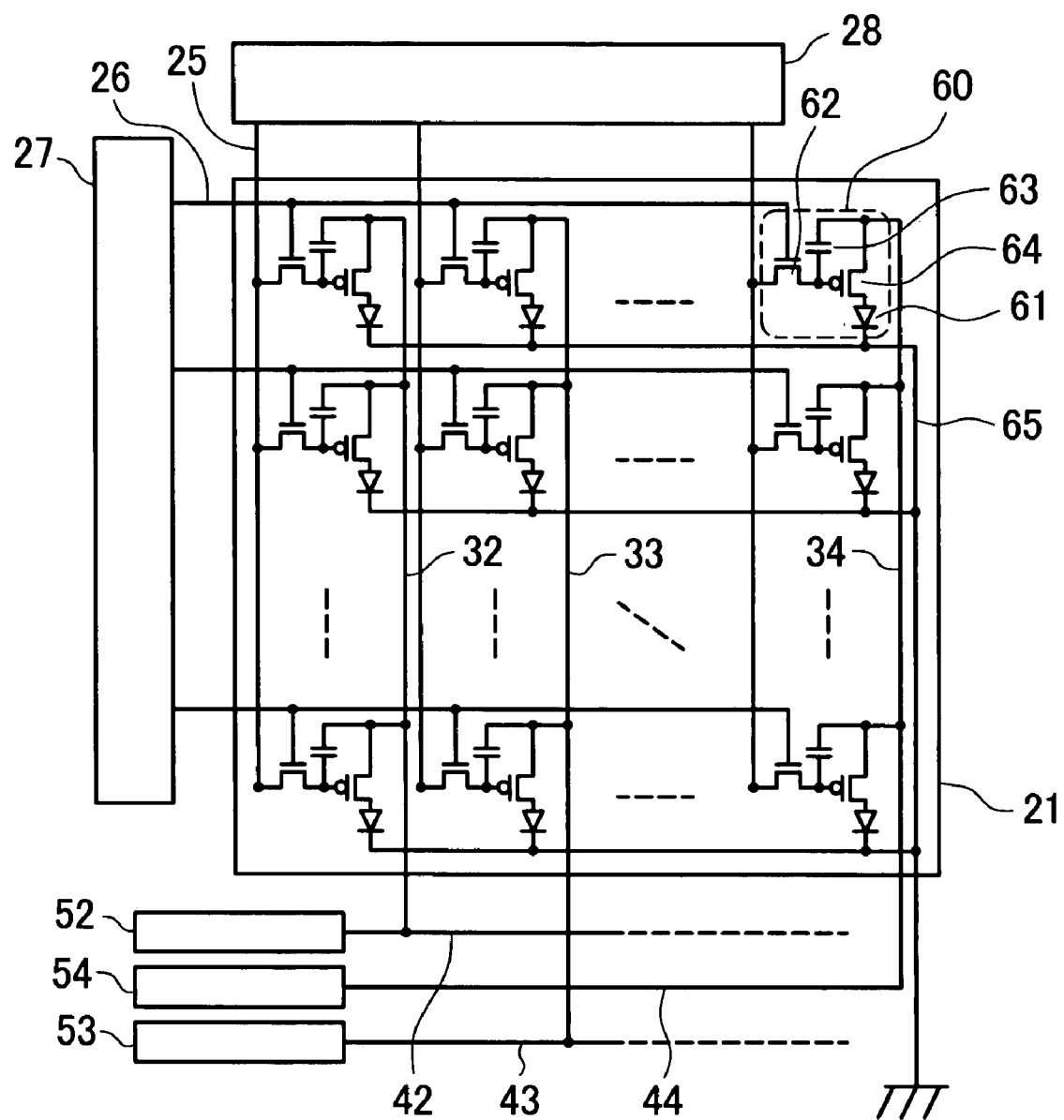
FIG. 3 is a detailed view of a pixel made of an organic EL element shown in FIG. 2.

FIG. 3 is a detailed view of the pixels each of which is formed of the organic EL element shown in FIG. 2. Numerals equal to the numerals used in FIG. 2 for indicating the parts indicate identical parts. In FIG. 3, a plurality of pixel regions 60 are formed within the display region 21, and an organic EL element 61 which constitutes the color pixel is formed in the pixel region 60. Further, in the pixel region 60, a switching TFT 62 which is selected by the scanning signal drive circuit 27 and acquires the data signals from the data signal drive circuit 28, a capacitance 63 which stores the data signals, and a driver TFT 64 which drives the organic EL element 61 in response to the data signals are provided.

The organic EL element 61 has an anode side thereof connected to the driver TFT 64 and a cathode side thereof connected to a cathode current line 65 which holds a reference potential.

Figure 4:
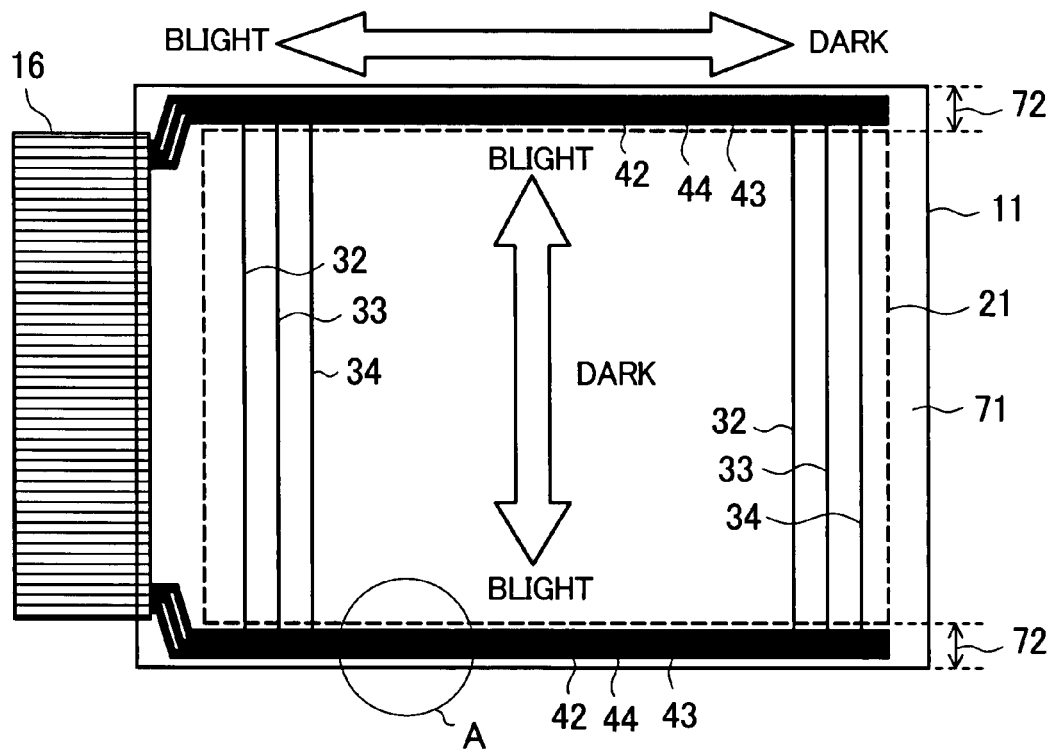
FIG. 4 is an arrangement view of a power source bus line shown in FIG. 2 and FIG. 3.

FIG. 4 is an arrangement view of the power source bus lines shown in FIG. 2 and FIG. 3. In FIG. 4, numerals which are equal to the numerals used in FIG. 2 and FIG. 3 indicate identical parts. In FIG. 4, a region of the display panel 11 is divided into the display region 21 and a peripheral region 71 which surrounds the display region 21, wherein regions above and below the peripheral region 71 constitute picture frame regions 72.

Since the organic EL element is driven based on an electric current, relatively bold power source bus lines 42, 43, 44 are arranged on either one of picture frame regions 72 thus suppressing the non-uniformity of brightness in-plane distribution in the lateral direction of the display panel 11 attributed to a voltage drop. In this embodiment, by arranging the power source bus lines 42, 43, 44 in the upper and lower picture frame regions 72 of the display panel 11, the non-uniformity of the brightness in-plane distribution in the longitudinal direction of the display panel 11 can be suppressed.

In this manner, when the power source bus lines 42, 43, 44 become bold, it is necessary to widen the picture frame region 72 and hence, a so-called picture frame size is increased thus interrupting the miniaturization of the panel. Here, along with the narrowing of the power source bus lines, a voltage drop is increased, while along with the increase of a distance from the power source, the brightness is lowered thus giving rise to the non-uniformity of the brightness in-plane distribution in the lateral direction and the longitudinal direction of the display panel 11 as shown in FIG. 4. Accordingly, it is necessary to design the widths of the power source bus lines to an extent that the non-uniformity of the brightness in-plane distribution is not visible.

Figure 5:
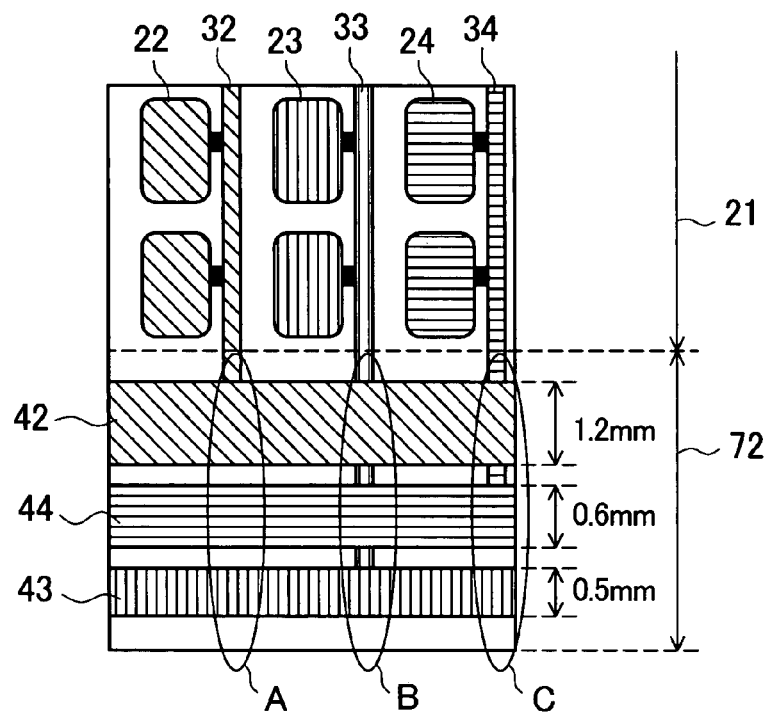
FIG. 5 is an enlarged view of a portion A shown in FIG. 4.

FIG. 5 is an enlarged view of a portion A shown in FIG. 4. Although widths of all three power source bus lines are equal in the conventional structure, in this embodiment, the respective widths of the power source bus lines are changed. Along with the increase of current quantity, the bus line is made bolder, while along with the decrease of current quantity, the bus line is made finer. In either case, the line width of the bus line is made as fine as possible provided that no non-uniformity of the brightness in-plane distribution occurs.

In FIG. 5, the widths of the power source bus lines 42, 43, 44 can be changed corresponding to flowing current quantities irrelevant to light-emitting colors of the pixels 22, 23, 24. For example, while a current efficiency of the red pixel 21 which performs a red display is 3 cd/A, and the brightness of the display panel when the full screen of the display panel is displayed in red (maximum gray scale) is set to 50 cd/m2, these values are not directly relevant to the widths of the power source bus lines. A current quantity which flows when the full screen of the display panel is displayed in red, maximum current quantities which flow in the power source lines 32, 33, 34 via the power source bus lines 42, 43, 44 become factors which decide the widths of the power source bus lines.

In this embodiment, as shown in a following Table 1, an organic EL display device having a diametrical length of 63 mm is used as an example. In this case, the maximum current quantities in red, in green and in blue are 31.5 mA, 12.5 mA and 16.0 mA respectively. In performing a full-screen monochroic display using this display device, when the widths of the power source bus lines are narrow, the non-uniformity of the brightness in-plane distribution occurs in the lateral direction of the panel, while when the widths of the power source bus lines are bold, the non-uniformity of the brightness in-plane distribution becomes invisible. Since the line widths which make the non-uniformity of the brightness in-plane distribution invisible are 1.2 mm or more in red, 0.5 mm or more in green and 0.6 mm or more in blue and hence, the widths of the power source bus lines are respectively set to 1.2 mm, 0.5 mm and 0.6 mm.

TABLE 1

Case in which an organic EL display device (display region being 37 mm × 51 mm) having a diagonal length of 63 mm is used.

|  | current efficiency of pixel (cd/A) | At the time of performing full-screen monochroic panel display | | Power source line width which makes brightness distribution invisible (mm) |
|---|---|---|---|---|
|  |  | Brightness (cd/m$^2$) | Current quantity (mA) |  |
| Red display | 3 | Approximately 50 | 31.5 | 1.2 mm or more |
| Green display | 15 | Approximately 100 | 12.5 | 0.5 mm or more |
| Blue display | 6 | Approximately 50 | 16.0 | 0.6 mm or more |

EMBODIMENT 2

Figure 6A:
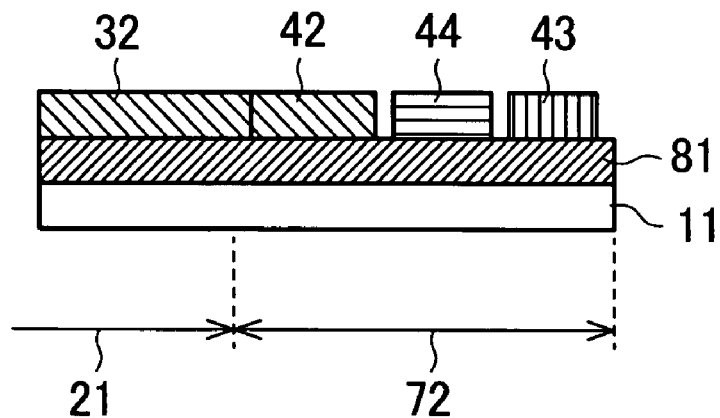
FIG. 6 is a cross-sectional view of a connection part between a power source bus line and a power source line.
Figure 6B:
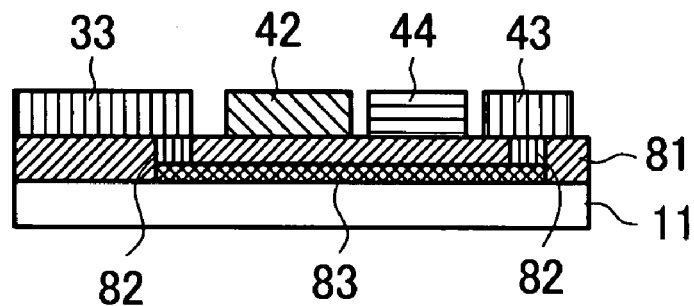
Figure 6C:
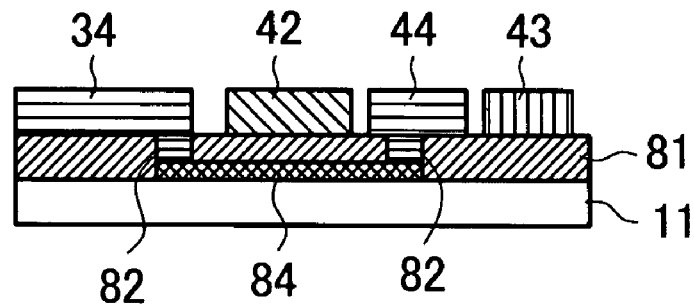

FIG. 6A to FIG. 6C are cross-sectional views of a connection between power source bus lines and a power source line, wherein FIG. 6A to FIG. 6C are respectively cross-sectional views of portions A, B and C in FIG. 5. In FIG. 6A to FIG. 6C, while respective power source lines 32, 33, 34 are made of Al (sheet resistance: 0.1 $\Omega/\square$), connection lines 83, 84 at line intersecting portions are made of MoW (sheet resistance: 1 $\Omega/\square$) which is a gate line material of a switching TFT.

The connection lines 83, 84 made of MoW are electrically connected to the power source lines 33, 34 made of Al in the same manner as power source bus lines 43, 44 made of Al via contact holes 82 formed in the insulation layer 81. In this case, since the resistance relationship is set as the resistance of MoW>> the resistance of Al and hence, assuming that the connection line is used as the power source bus line of a large current quantity, a voltage drop may become large. Further, even when the connection line is used as the power source bus line, it is desirable to shorten the length of the connection line. Accordingly, the bold power source bus line of a large current quantity is arranged inside and the fine power source line of a small current quantity is arranged outside.

In this embodiment, by arranging the power source bus line 42 for red of a large current quantity on a side close to a display region and by arranging the power source bus line 43 for green of a small current quantity on a side remote from the display region, the influence of the voltage drop is reduced.

What is claimed is:

1. An organic EL display device comprising:
    a display region which includes a plurality of pixels;
    a peripheral region which surrounds the display region;
    power source lines which extend to pixel regions from the peripheral region and supply electricity to pixels which emit light in same colors; and
    a plurality of power source bus lines which connect the power source lines which supply electricity to the pixels which emit light in same color in the peripheral region and pull around to external terminals, wherein
    the power source bus lines include the first power source bus line which connects the first power source lines which supply electricity to the pixels which emit light in first color, and the second power source bus line which connects the second power source lines which supply electricity to the pixels which emit in second color, and
    in a state that a maximum current quantity which flows in the first power source bus line is larger than a maximum current quantity which flows in the second power source bus line, the first power source bus line is arranged closer to a display region than the second power source bus line.

2. An organic EL display device according to claim 1, wherein the first power source bus line and the power source lines are connected with each other on a same layer.

3. An organic EL display device according to claim 1, wherein the second power source bus line and the power source lines are connected with each other through contact holes via connection lines formed on a lower layer.

4. An organic EL display device according to claim 1, wherein a width of the first power source bus line is set larger than a width of the second power source bus line.

5. An organic EL display device according to claim 2, wherein a width of the first power source bus line is set larger than a width of the second power source bus line.

6. An organic EL display device according to claim 3, wherein a width of the first power source bus line is set larger than a width of the second power source bus line.

* * * * *